(12) United States Patent
Pala (10) Patent No.: US 7,701,374 B2
(45) Date of Patent: Apr. 20, 2010

(54) METHOD AND APPARATUS FOR AUTOMATIC OPTIMAL SAMPLING PHASE DETECTION

(75) Inventor: Costantino Pala, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 12/037,272

(22) Filed: Feb. 26, 2008

(65) Prior Publication Data

US 2009/0212824 A1    Aug. 27, 2009

(51) Int. Cl.
 *H03M 1/12* (2006.01)
(52) U.S. Cl. ....................... 341/155; 341/111
(58) Field of Classification Search ............. 341/155, 341/118, 111, 159, 122
See application file for complete search history.

(56) References Cited

U.S. PATENT DOCUMENTS

| | | | |
|---|---|---|---|
| 6,043,803 A | 3/2000 | Shimizu | |
| 6,268,848 B1 | 7/2001 | Eglit | |
| 6,380,908 B1 * | 4/2002 | Andrews et al. | ............ 343/853 |
| 6,473,013 B1 * | 10/2002 | Velazquez et al. | ........... 341/120 |
| 7,148,828 B2 * | 12/2006 | Fernandez et al. | .......... 341/120 |
| 7,397,876 B2 * | 7/2008 | Cranford et al. | ............ 375/355 |
| 2007/0008195 A1 * | 1/2007 | Jin | .............................. 341/61 |

* cited by examiner

*Primary Examiner*—Peguy JeanPierre
(74) *Attorney, Agent, or Firm*—Jackson Walker L.L.P.; Christopher J. Rourk (57) ABSTRACT

A system for determining an optimal sampling phase is provided. The system includes a plurality of analog to digital converters, each receiving an analog signal and a clock phase signal and generating an output. A clock generator receives a reference clock and generates a plurality of clock phase signals. A sampling phase system receives the plurality of outputs of the analog to digital converters and generates an optimal sampling phase.

22 Claims, 5 Drawing Sheets

METHOD AND APPARATUS FOR AUTOMATIC OPTIMAL SAMPLING PHASE DETECTION

FIELD OF THE INVENTION

The invention relates to phase detection, and more specifically to a method and apparatus for automatic optimal sampling phase detection that does not require sample storage and statistical analysis of stored samples.

BACKGROUND OF THE INVENTION

In applications where receiver needs to sample and digitize multiple input signals of unknown phase with respect to the clock, the input signal may be corrupted (e.g. slow settling, ringing), due bandwidth limitations in the transmission channel, impedance mismatch or other phenomena. In order to minimize bit-error rate or the sampling accuracy, the receiver needs to find the optimal sampling point. Previous solutions utilize statistical methods and have limitations in the highest signal frequency or the minimum channel bandwidth.

SUMMARY OF THE INVENTION

The current invention provides a method and apparatus for automatic optimal sampling phase detection that does not require sample storage and statistical analysis of stored samples.

In accordance with an exemplary embodiment of the present invention, a system for determining an optimal sampling phase is provided. The system includes a plurality of analog to digital converters, each receiving an analog signal and a clock phase signal and generating an output. A clock generator receives a reference clock and generates a plurality of clock phase signals. A sampling phase system receives the plurality of outputs of the analog to digital converters and generates an optimal sampling phase.

Those skilled in the art will further appreciate the advantages and superior features of the invention together with other important aspects thereof on reading the detailed description that follows in conjunction with the drawings.

DETAILED DESCRIPTION OF PREFERRED EMBODIMENTS

In the description that follows, like parts are marked throughout the specification and drawings with the same reference numerals, respectively. The drawing figures might not be to scale, and certain components can be shown in generalized or schematic form and identified by commercial designations in the interest of clarity and conciseness.

Figure 1:
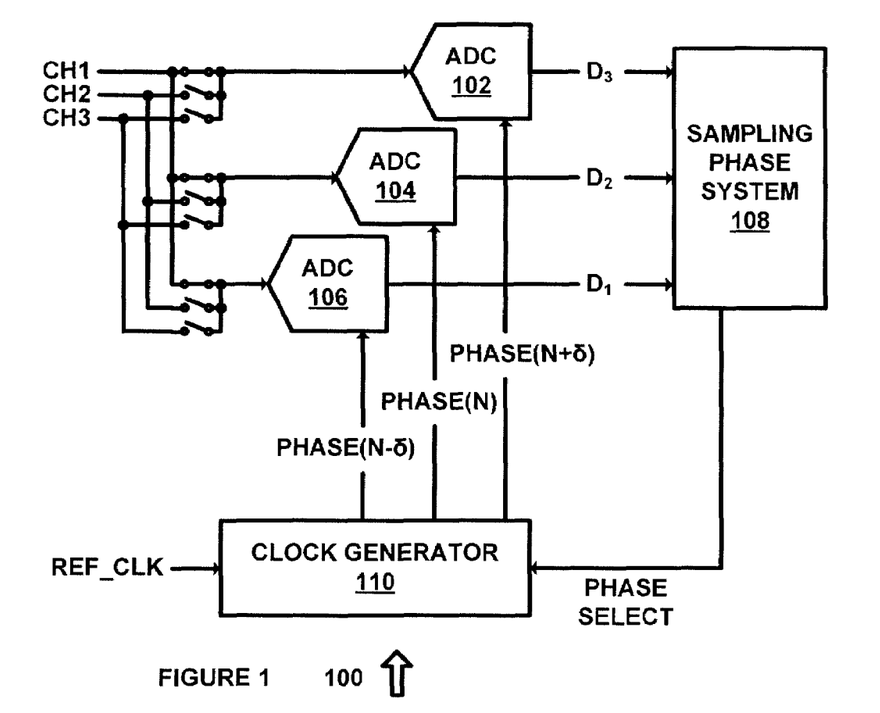
FIG. 1 is a diagram of a system for determining an optimal sampling point of a received digital signal in accordance with an exemplary embodiment of the present invention.

FIG. 1 is a diagram of a system 100 for determining an optimal sampling point of a received digital signal in accordance with an exemplary embodiment of the present invention. System 100 allows the optimal sampling point to be determined without storing sample data or requiring statistical analysis of sample data.

System 100 includes channel inputs CH1, CH2, and CH3. Other suitable numbers of channel input can also or alternatively be used. As shown in FIG. 1, channel input CH1 has been selected to provide inputs for optimal sampling detection.

The inputs from channel input CH1 are provided to analog to digital converters 102, 104 and 106. Analog to digital converters 102 through 106 each generate a sample data output D3, D2, and D1. Sampling phase system 108 receives the sample outputs and stores a running average of the differences between sample outputs D1 and D2 and D3 and D2.

Analog to digital converters 102 through 106 each receive a phased clock signal. In one exemplary embodiment, analog to digital converter 102 receives phase N+δ of the clock signal, analog to digital converter 104 receives phase N of the clock signal, and analog to digital converter 106 receives phase N−δ of the clock signal. In this exemplary embodiment, δ can be selected based on processes performed by sampling phase system 108, user control settings or other suitable criteria. In one exemplary embodiment, sampling phase system 108 can change the value of δ based on the results obtained from optimal sampling phase detection processing, where δ is an integer value related to the number of sampling phases per clock cycle.

Clock generator 110 receives a reference clock signal and generates a plurality of phases of clock signals based on the referenced clock. In one exemplary embodiment, clock generator 110 can generate eight reference phases, where the inputs to analog to digital converters 102 to 106 are selected from the eight reference phases and the value of δ.

Sampling phase system 108 generates a phase select control to clock generator 110, which determines whether to increment the phase N, the value of δ, or other suitable criteria. In one exemplary embodiment, sampling phase system 108 can be implemented in hardware, software or a suitable combination of hardware and software, and can be one or more software systems operating on a digital signal processor or other suitable platforms. As used herein, "hardware" can include a combination of discrete components, an integrated circuit, an application-specific integrated circuit, a field programmable gate array, a digital signal processor, or other suitable hardware. As used herein, "software" can include one or more objects, agents, threads, lines of code, subroutines, separate software applications, two or more lines of code or other suitable software structures operating in two or more software applications or on two or more processors, or other suitable software structures. In one exemplary embodiment, software can include one or more lines of code or other suitable software structures operating in a general purpose software application, such as an operating system, and one or more lines of code or other suitable software structures operating in a specific purpose software application.

In operation, system 100 determines the optimal sampling phase for a signal by detecting the sampling phase that corresponds to the signal transition point. In one exemplary embodiment, the difference between a plurality of samples at each of a plurality clock phase points are summed over a predetermined number of clock cycles and compared to values from different clock phases so as to allow samples from two different phase periods to be consecutively compared to determine the sampling phase that provides the optimal sampling point. In this exemplary embodiment, the leading edge of a sampling period can be detected for a maximum, such as where a transition point from a low value to a high value occurs. Likewise, the trailing edge of the sample can be determined based on a minimized value, such as where the signal is flat prior to the transition period. In this manner, signal variations caused by slow settling, ringing, noise, or other phenomena can be compensated for and an optimal sampling phase can be determined.

Figure 2:
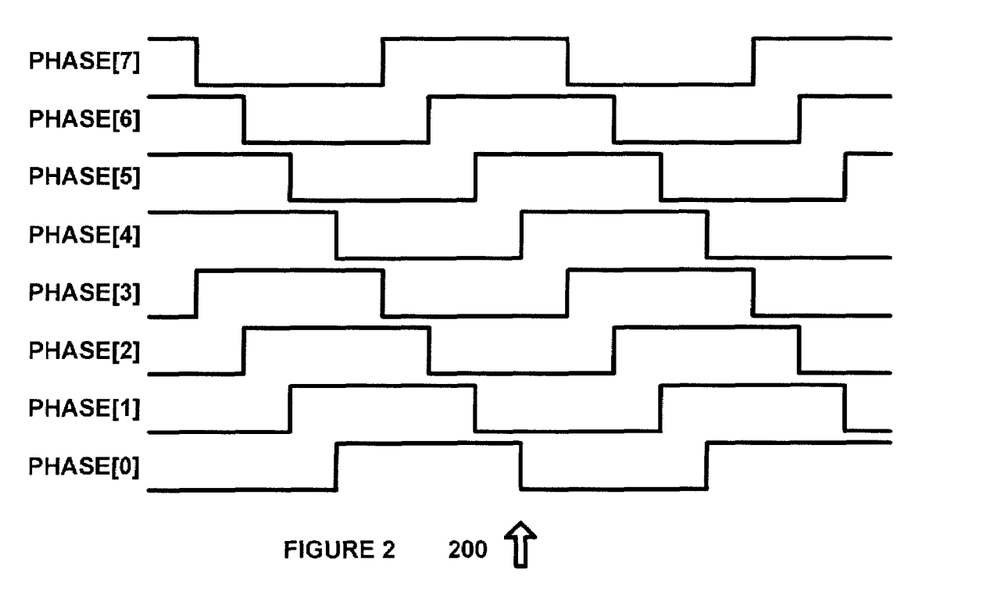
FIG. 2 is a diagram of clock signals in accordance with an exemplary embodiment of the present invention.

FIG. 2 is a diagram of clock signals 200 in accordance with an exemplary embodiment of the present invention. Clock signals 200 include eight exemplary phases, but other suitable numbers of phases could also or alternatively be used. As shown in FIG. 2, phase 0 is the first phase to have a clock transition from a low value to a high value, phase 1 is the next phase to have a transition from a low value to a high value, and so forth until phase 7 is reached. In this exemplary embodiment, an analog to digital converter receiving one of the 8 clock signals will sample signal received at an input of the analog to digital converter at the transition point.

The input to clock generator 110 can be divided into a predetermined number of phases, and the difference between the phases can be adjusted to detect the phase difference resulting in an optimal sampling point. For example, the phase difference δ can be set to 1 such that analog to digital converter 102 receives phase 2, analog to digital converter 104 receives phase 1 and analog to digital converter 106 receives phase 0. In this manner, the value of D1 will represent the first sample of a sample period, the value of D2 will represent the second sample of a sample period, and the value of D3 will represent the third sample of the sample period. The transitional edge of a received signal can be determined just by maximizing the difference between D3 and D2 and minimizing the difference between D1 and D2.

Figure 3:
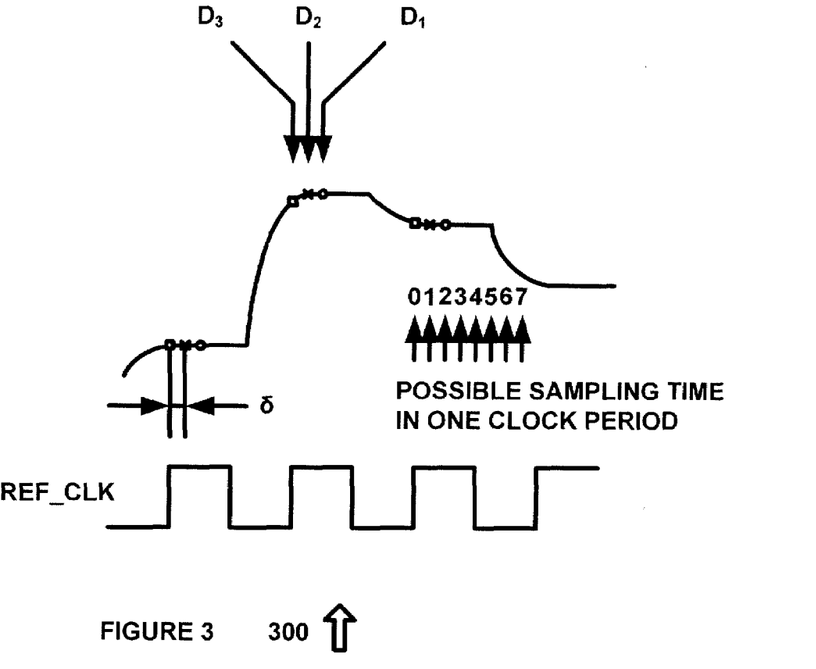
FIG. 3 is a diagram of a wave form showing sample periods in accordance with an exemplary embodiment of the present invention.

FIG. 3 is a diagram of a wave form 300 showing sample periods in accordance with an exemplary embodiment of the present invention. Wave form 300 includes reference clock signal and three sampling phases in each clock cycle. As shown in wave form 300, there are 8 possible sampling phases in one clock period. In this exemplary embodiment, δ has been selected to equal the integer value of 1, such that the first phase is use to generate sample value D1, the second phase is used to generate the sample value D2, and the third phase is used to generate the sample value D3. Three exemplary sampling points are shown in wave form 300, corresponding to each clock cycle of reference clock signal. In this exemplary embodiment, the difference between D1 and D2 is smaller than the difference between D3 and D2 (and so will be the accumulation of a number of these differences), therefore the transition point of the wave form has not been sampled. Samples D1, D2 and D3 are each taken at locations where the wave form is coming to a flat region. Thus, for the samples shown and the wave form 300, it would be anticipated that PHASE[1] is not representative of an optimal sampling phase.

Figure 4:
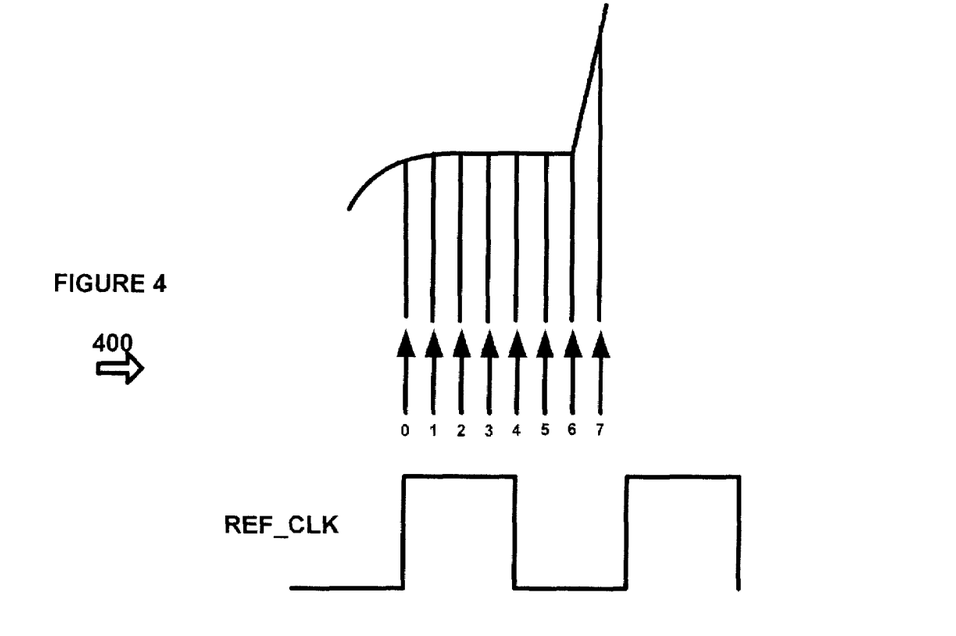
FIG. 4 is a diagram of a detail from FIG. 3 in accordance with an exemplary embodiment of the present invention.

FIG. 4 is a diagram of a detail 400 from FIG. 3 in accordance with an exemplary embodiment of the present invention. Detail 400 shows eight exemplary sampling phases for one clock cycle, in the approximate location on the wave form being sampled where the sampling period would correspond to. In this exemplary embodiment, it can be seen that the greatest transition would occur between sampling phases six and seven, as this results in the greatest difference D3-D2 indicative of the leading edge of the wave form. Likewise, the difference between sampling phases five and six would result in a value that is at or near a minimum. In this exemplary embodiment, system 100 would select sampling phase five of the reference clock phases as the optimal sampling period.

In operation, the received wave form may include ringing, noise or other phenomena that alter the wave form. Thus, in operation it may be necessary to perform a sampling over a number of reference clock cycles, and to compare the running sum of the difference data to determine the maximum leading edge transition period and minimum trailing edge transition period. Likewise, if it is determined that a maximum has been determined for the leading edge transition but that the trailing edge transition is not the minimum, the sampling period can nonetheless be selected so as to select the maximum leading edge transition period. Other suitable processes can be used, such as a subsequent comparison of the trailing edge period for the maximum leading edge period with the trailing edge period having the minimum value, or other suitable processes.

For example, it may be determined that the difference between D2 and D3 of sampling phases six and seven results in the maximum difference, indicative of the transition point, but that the difference between sampling phases one and two results in the minimum difference. In this exemplary embodiment, the difference between sampling phases one and two can be compared to the difference between sampling phases six and seven to determine whether the difference in the minimum value is greater than a predetermined tolerance. If the difference is greater than the predetermined tolerance, additional sampling periods can be used, such as by changing the value of δ to two, so that sampling phases (6, 0, 2) are compared to sampling phases (7, 1, 3), (0, 2, 4), (1, 3, 5) (2, 4, 6), (3, 5, 7), (4, 6, 0), and (5, 7, 1). Likewise, if the difference between sampling phases one and two sampling phases six and seven is within a predetermined tolerance, then sampling phases (6, 7, 8) can be selected as the optimal sampling phases.

Figure 5:
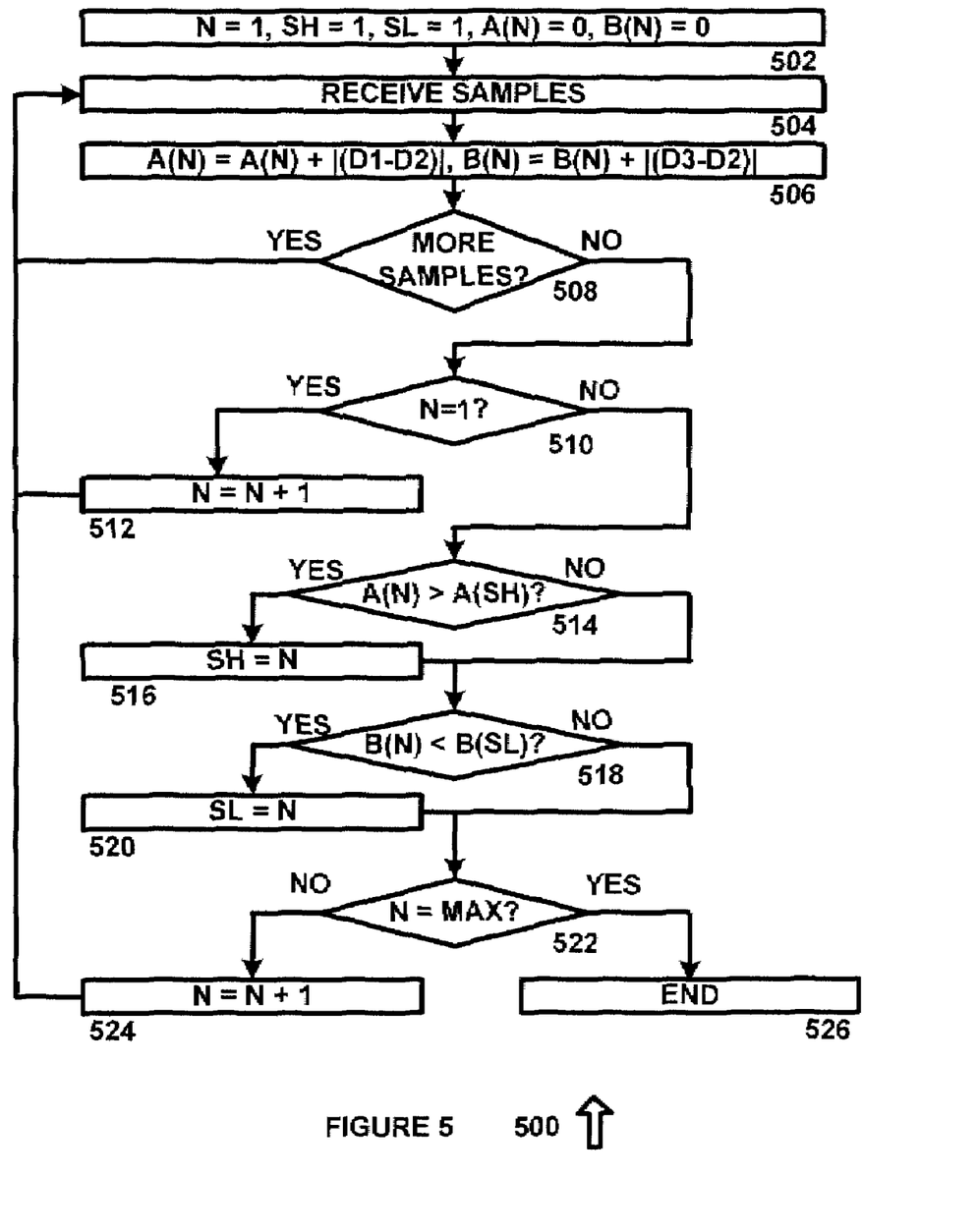
FIG. 5 is a flow chart of a method in accordance with an exemplary embodiment of the present invention.

FIG. 5 is a flow chart of a method 500 in accordance with an exemplary embodiment of the present invention. Method 500 begins at 502 where parameters are initialized, such as by setting N=1, a sample high SH variable equal to 1, a sample low SL variable=1, the values of an array A(N)=0 and the values of an array B(N)=0. The method then proceeds to 504 where samples are received. In one exemplary embodiment, the samples can be the three values sampled by analog to digital converters 102 through 106 of system 100 or other suitable samples. The method then proceeds to 506.

At 506, a running value of A(N) and B(N) is determined, such as by subtracting a middle sample value (such as D2 of waveform 300) from a leading edge sample value (such as D1 of waveform 300), and adding the absolute value of that operation to the previous value of A(N), and by subtracting a middle sample value (such as D2 of waveform 300) from a trailing edge sample value (such as D3 of waveform 300) and adding the absolute value of that operation to the previous value of B(N) The method then proceeds to 508.

At 508, it is determined whether more samples should be received. In one exemplary embodiment, the total of a plurality of samples generated by a sampling phases related to a reference clock can be used to determine the optimal sampling phase, such as by comparing leading edge sample values for a predetermined number of samples of a sampling phase to detect the sampling phase that generates a maximum leading edge sample value, and by comparing trailing edge sample values for a predetermined number of samples of a sampling phase to detect the sampling phase that generates a minimum trailing edge sample value. Likewise, other suitable processes can be used. If it is determined at 508 that more samples are required, the method returns to 504. Otherwise, the method proceeds to 510.

At 510, it is determined whether N=1, indicating that samples from additional sampling phases must be obtained. If it is determined that 510 and is equal to 1, the method proceeds to 512 where N is incremented to N+1. Otherwise, the method proceeds to 514.

At 514, it is determined whether the current value of A(N) is greater than the value of A(SH). For example, after initially running through samples for periods N=1 and N=2, the value of N will equal 2 and the value of sample high will equal 1, such that a comparison is made between the leading edge values for the first and second sampling periods. If it is determined that A(N) is greater than A(SH), the method proceeds to 516 where the value of SH is set equal to the current value of N. Otherwise, the method proceeds to 518.

At 518, it is determined whether the current value of B(N) is less than the value of B(SL). As previously discussed, in the initial operation of method 500, N=2 and SL=1, and it will be determined whether the trailing edge samples for the second sampling period are less than the trailing edge sampling period. If it is determined that B(N) is less than B(SL), the method proceeds to 520 where the value of SL is set equal to N. Otherwise, the method proceeds to 522.

At 522, it is determined whether N equals the maximum value. In one exemplary embodiment, where there are 8 possible sampling phases and δ=1, the maximum value of N will equal 6, as there will be 6 possible comparison points for a process having 8 possible sampling points. If it is determined at 522 that N does not equal the maximum value, then the method proceeds to 524 where N is incremented by 1. Otherwise, the method proceeds to 526 and terminates.

In operation, method 500 allows an optimal sampling phase to be determined by detecting the sampling point at which a leading edge sample has a greatest value and trailing edge sample has a minimum value over a number of sampling clock periods. In one exemplary embodiment, the values obtained for SH and SL will be equal. However, the value of interest may be the value of SH which yields the maximum, which indicates a leading edge. Thus, if it is determined that SH does not equal SL, additional processes can be used, such as storing the values of B(N) and performing a comparison between the value of B(N) for SH and B(SL) to determine whether the values differ by an acceptable variation. Likewise, other suitable processes can be used.

Figure 6:
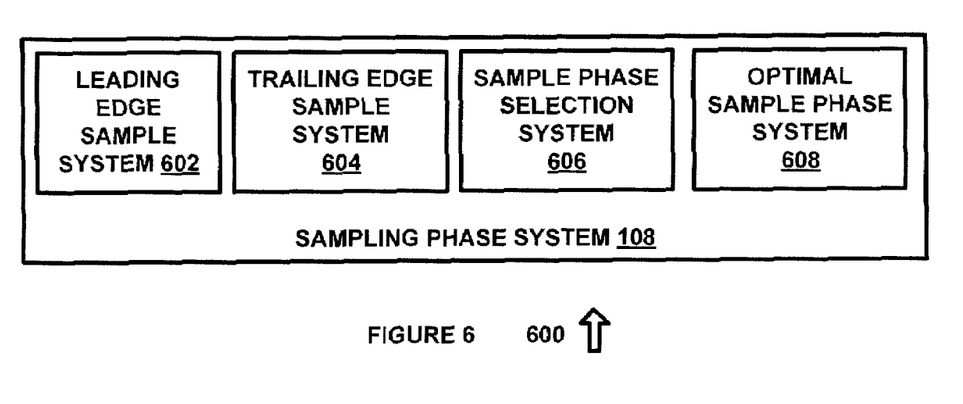
FIG. 6 is a diagram of a system for selecting an optimal sampling phase in accordance with an exemplary embodiment of the present invention.

FIG. 6 is a diagram of a system 600 for selecting an optimal sampling phase in accordance with an exemplary embodiment of the present invention. System 600 includes sampling phase system 108 and leading edge sample system 602, trailing edge sample system 604, sample phase selection system 606 and optimal sample phase system 608, each of which can be implemented in hardware, software, or a suitable combination of hardware and software, and which can be one or more software systems operating on a digital signal processing platform.

Leading edge sample system 602 receives two or more of the outputs of the analog to digital converters and generates a maximum leading edge sampling phase. In one exemplary embodiment, leading edge sample system 602 can receive outputs D2 and D3 from analog to digital converters 104 and 102, respectively, and can store a running total of the value of the difference between outputs D3 and D2 over a predetermined number of clock cycles. Leading edge sample system 602 can compare the final value for the current sample phase with a final value for a previous sample phase, so as to generate the maximum leading edge sampling phase based on the greater of the two final values. In this manner, storage and statistical analysis of a large number of samples is not required in order to detect the leading edge.

Trailing edge sample system 604 receives two or more of the outputs of the analog to digital converters and generates a minimum trailing edge sampling phase. In one exemplary embodiment, trailing edge sample system 604 can receive outputs D1 and D2 from analog to digital converters 106 and 104, respectively, and can store a running total of the value of the difference between outputs D1 and D2 over a predetermined number of clock cycles. Trailing edge sample system 604 can compare the final value for the current sample phase with a final value for a previous sample phase, so as to generate the minimum trailing edge sampling phase based on the lesser of the two final values. In this manner, storage and statistical analysis of a large number of samples is not required in order to detect the trailing edge.

Sample phase selection system 606 generates a clock phase select signal, such as increment the clock phases that are provided to analog to digital converters 102 through 106, to change the value of δ, or in other suitable manners. In one exemplary embodiment, the clock phase select signal can include a phase select value and a value of δ. In another exemplary embodiment, the clock phase select signal can include a set of clock phases, such as (1, 2, 3) where the value of δ=1 is implicit in the set of clock phases.

Optimal sample phase system 608 generates the optimal sampling phase based on a leading edge sample phase and a trailing edge sample phase. In one exemplary embodiment, optimal sample phase system 608 can determine whether the leading edge sample phase and the trailing edge sample phase are adjacent, such that a new value of δ can be selected if it is determined that the leading edge sample phase and the trailing edge sample phase are not adjacent. In this exemplary embodiment, where the value of δ=1, if the leading edge sample phase is between samples 7 and 8 and the trailing edge sample phase is between 2 and 3, optimal sample phase system 608 can generate a control signal to cause sample phase selection system 606 to select a new value of δ. In another exemplary embodiment, optimal sample phase system 608 can compare sample phases to determine whether the maximum or minimum values for two different sample phases are within predetermined allowable variation. In this exemplary embodiment, where the value of δ=1, if the leading edge sample phase is between samples 7 and 8 and the trailing edge sample phase is between 2 and 3, optimal sample phase system 608 can compare the total for sample phases 6 and 7 with the total for sample phases 2 and 3 to determine whether the totals are within a predetermined tolerance, so as to avoid the need for further sampling with a new value of δ. Other suitable processes can also or alternatively be used.

Figure 7:
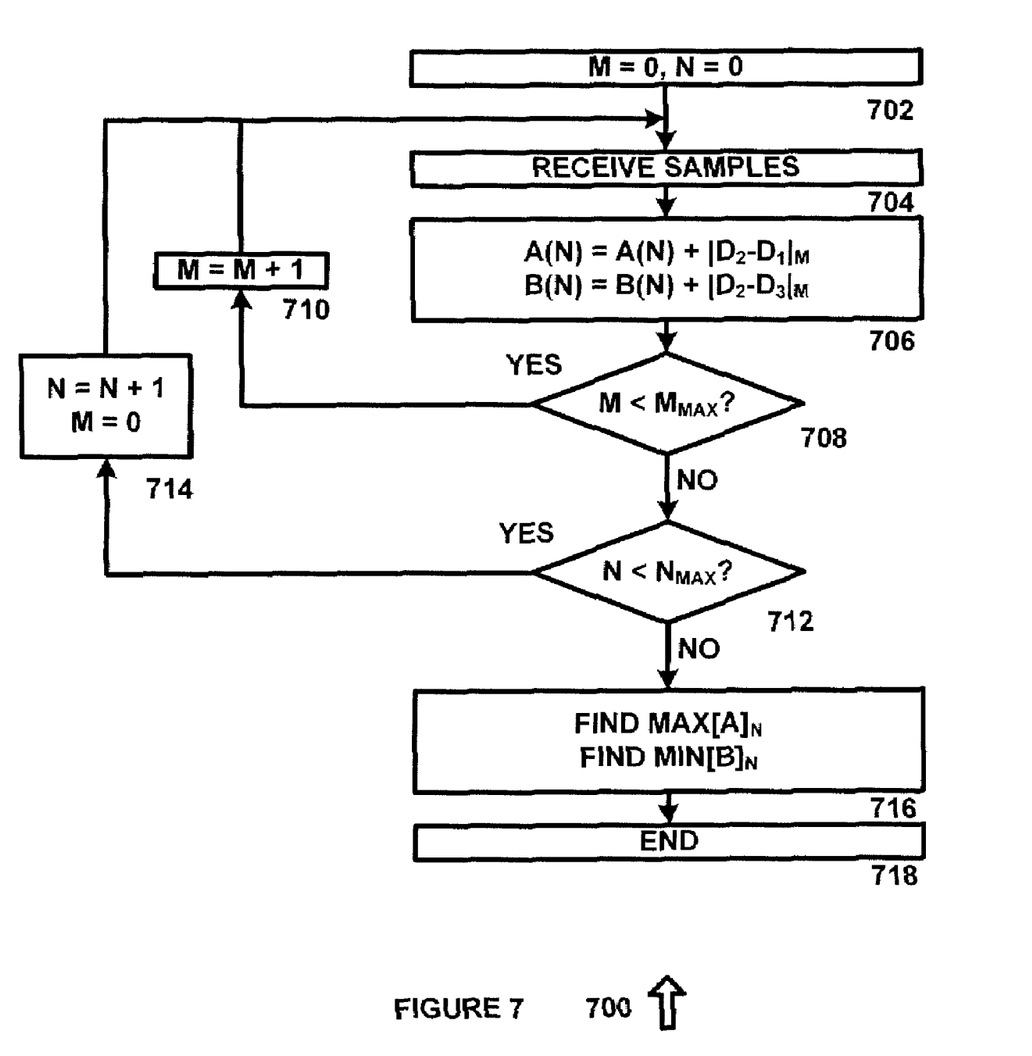
FIG. 7 is a flow chart of a method in accordance with an exemplary embodiment of the present invention.

FIG. 7 is a flow chart of a method 700 in accordance with an exemplary embodiment of the present invention. Method 700 begins at 702, where counters M (representing a number of sample periods) and N (representing a sample phase period) are initialized to zero. The method then proceeds to 704, where samples are received. The method then proceeds to 706 where a running value of A(N) and B(N) is updated in accordance with the following equations:

$$A(N)=A(N)+|D_2-D_1|M$$

$$B(N)=B(N)+|D_2-D_3|M$$

where

A(N)=trailing edge sample phase difference

B(N)=leading edge sample phase difference
D$_1$=first sample phase
D$_2$=second sample phase
D$_3$=third sample phase The method then proceeds to 708.

At 708, it is determined whether the current value of M is less than a maximum value of M. If it is determined that the current value of M is less than a maximum value of M, the method proceeds to 710, where the value of M is incremented by one. The method then returns to 704. Otherwise, the method proceeds to 712.

At 712, it is determined whether the current value of N is less than a maximum value of N. If it is determined that the current value of N is less than a maximum value of N, the method proceeds to 714, where the value of N is incremented by one, and the value of M is reset to zero. The sample phases D$_1$, D$_2$ and D$_3$ are also incremented, such as where the number of the current sample phase period is used to determine the sample phases. The method then returns to 704. Otherwise, the method proceeds to 716.

At 716, the sample phase periods corresponding to a maximum value of A(N) and a minimum value of B(N) are determined, such as by comparing the values of A(N) and B(N) or by other suitable processes. The method then proceeds to 718 and terminates.

Although exemplary embodiments of an apparatus of the present invention have been described in detail herein, those skilled in the art will also recognize that various substitutions and modifications can be made to the apparatus without departing from the scope and spirit of the appended claims.

What is claimed is:

1. A system for determining an optimal sampling phase comprising:
    a plurality of analog to digital converters, each for receiving an analog signal and a clock phase signal and generating one output each sample period;
    a clock generator for receiving a reference clock and generating a plurality of clock phase signals; and
    a sampling phase system for receiving the plurality of outputs of the analog to digital converters over two or more sample periods and generating an optimal sampling phase based on the plurality of outputs of the analog to digital converters over two or more sample periods.

2. The system of claim 1 wherein the sampling phase system comprises a leading edge sample system for receiving two or more of the outputs of the analog to digital converters and generating a maximum leading edge sampling phase.

3. The system of claim 1 wherein the sampling phase system comprises a trailing edge sample system for receiving two or more of the outputs of the analog to digital converters and generating a minimum trailing edge sampling phase.

4. The system of claim 1 wherein the sampling phase system comprises a sample phase selection system for generating a clock phase select signal, and the clock generator is for receiving the clock phase select signal and for generating the plurality of clock phase signals in response to the clock phase select signal.

5. The system of claim 1 wherein the sampling phase system comprises an optimal sample phase system for generating the optimal sampling phase based on a leading edge sample phase and a trailing edge sample phase.

6. The system of claim 1 wherein the clock generator is for receiving a clock phase select signal and for generating the plurality of clock phase signals in response to the clock phase select signal.

7. A method for determining an optimal sampling phase comprising:
    receiving a signal;
    generating a plurality of samples of the signal;
    determining a maximum leading edge sample difference; and
    selecting a sample phase associated with the maximum leading edge sample difference as the optimal sampling phase.

8. The method of claim 7 further comprising determining a minimum trailing edge sample difference.

9. The method of claim 7 further comprising:
    generating two or more trailing edge sample differences;
    comparing the trailing edge sample differences to determine a minimum trailing edge sample difference; and
    selecting a sample phase associated with the minimum trailing edge sample difference as the optimal sampling phase.

10. The method of claim 9 wherein generating two or more trailing edge sample differences comprises:
    generating a first trailing edge sample difference using a difference between a sample from a first sample phase and a sample from a second sample phase; and
    generating a second trailing edge sample difference using a difference between the sample from the second sample phase and a sample from a third sample phase.

11. The method of claim 9 wherein generating two or more trailing edge sample differences comprises:
    generating a sum for a plurality of trailing edge sample differences from a first sampling phase; and
    generating a sum for a plurality of trailing edge sample differences from a second sampling phase.

12. The method of claim 7 further comprising generating two or more leading edge sample differences.

13. The method of claim 12 wherein generating two or more leading edge sample differences comprises:
    generating a first leading edge sample difference using a difference between a sample from a first sample phase and a sample from a second sample phase; and
    generating a second leading edge sample difference using a difference between the sample from the second sample phase and a sample from a third sample phase.

14. The method of claim 12 wherein generating two or more leading edge sample differences comprises:
    generating a sum for a plurality of lea ding edge sample differences from a first sampling phase; and
    generating a sum for a plurality of leading edge sample differences from a second sampling phase.

15. A system for determining an optimal sampling phase comprising:
    means for generating a plurality of samples from an analog signal during one reference clock cycle;
    means for generating two or more sums of sample differences for a plurality of reference clock cycles; and
    means for selecting the optimal sampling phase based on the two or more sums of sample differences.

16. The system of claim 15 wherein the means for generating the plurality of samples from the analog signal during one reference clock cycle comprises a plurality of analog to digital converters.

17. The system of claim 15 wherein the means for generating two or more sums of sample differences for the plurality of reference clock cycles comprises a leading edge sample system.

18. The system of claim 15 wherein the means for selecting the optimal sampling phase based on the two or more sums of sample differences comprises an optimal sample phase system.

19. A sampling phase system comprising:
- a leading edge sample system for generating two or more leading edge sampling phase values;
- a trailing edge sample system for generating two or more trailing edge sampling phase values; and
- an optimal sample phase system for selecting an optimal sampling phase based on the leading edge sampling phase values and the trailing edge sampling phase values.

20. The sampling phase system of claim 19 further comprising a sample phase selection system for generating a clock phase select signal, wherein a clock generator is for receiving the clock phase select signal and generating a plurality of clock phase signals in response to the clock phase select signal.

21. The sampling phase system to claim 20 wherein the leading edge sample system is for receiving the plurality of clock phase signals and generating the two or more leading edge sampling phase values using the plurality of clock phase signals.

22. The sampling phase system of claim 20 wherein the trailing edge sample system is for receiving the plurality of clock phase signals and generating the two or more trailing edge sampling phase values using the plurality of clock phase signals.

* * * * *

UNITED STATES PATENT AND TRADEMARK OFFICE
CERTIFICATE OF CORRECTION

PATENT NO. : 7,701,374 B2 Page 1 of 1
APPLICATION NO. : 12/037272
DATED : April 20, 2010
INVENTOR(S) : Costantino Pala It is certified that error appears in the above-identified patent and that said Letters Patent is hereby corrected as shown below:

Col. 8, line 47, please change "lea ding" to -- leading --.

Signed and Sealed this

Eighth Day of June, 2010

David J. Kappos
*Director of the United States Patent and Trademark Office*